(12) United States Patent
Liu

(10) Patent No.: US 10,049,969 B1
(45) Date of Patent: Aug. 14, 2018

(54) INTEGRATED CIRCUIT

(71) Applicant: Allegro MicroSystems, LLC, Worcester, MA (US)

(72) Inventor: Shixi Louis Liu, Worcester, MA (US)

(73) Assignee: Allegro MicroSystems, LLC, Manchester, NH (US)

(*) Notice: Subject to any disclaimer, the term of this patent is extended or adjusted under 35 U.S.C. 154(b) by 0 days.

(21) Appl. No.: 15/624,875

(22) Filed: Jun. 16, 2017

(51) Int. Cl.
| *H01L 23/495* | (2006.01) |
| *H01L 23/31* | (2006.01) |
| *H01L 21/56* | (2006.01) |
| *H01L 23/00* | (2006.01) |
| *H01L 25/065* | (2006.01) |

(52) U.S. Cl.
CPC ...... *H01L 23/49575* (2013.01); *H01L 21/561* (2013.01); *H01L 23/3107* (2013.01); *H01L 23/49503* (2013.01); *H01L 24/32* (2013.01); *H01L 24/48* (2013.01); *H01L 25/0652* (2013.01); *H01L 2224/32245* (2013.01); *H01L 2224/48247* (2013.01)

(58) Field of Classification Search
CPC ......... H01L 23/49503; H01L 23/49541; H01L 23/49575; H01L 25/0652; H01L 25/071
See application file for complete search history.

(56) References Cited

U.S. PATENT DOCUMENTS

| 5,233,222 | A | * | 8/1993 | Djennas | ............... | H01L 21/565 |
| | | | | | | 257/666 |
| 7,816,772 | B2 | | 10/2010 | Engel et al. | | |
| 8,143,169 | B2 | | 3/2012 | Engel et al. | | |
| 9,013,033 | B2 | * | 4/2015 | Haba | ................. | H01L 23/492 |
| | | | | | | 257/698 |
| 2003/0141575 | A1 | * | 7/2003 | Yu | ................. | H01L 21/565 |
| | | | | | | 257/666 |
| 2008/0308914 | A1 | * | 12/2008 | Shen | ................. | H01L 23/3121 |
| | | | | | | 257/668 |
| 2009/0057915 | A1 | * | 3/2009 | Koike | ................. | H01L 23/4334 |
| | | | | | | 257/777 |
| 2009/0243064 | A1 | * | 10/2009 | Camacho | ........... | H01L 23/3121 |
| | | | | | | 257/680 |
| 2009/0278243 | A1 | * | 11/2009 | Chuang | ............... | H01L 21/4832 |
| | | | | | | 257/676 |
| 2011/0133732 | A1 | | 6/2011 | Sauber | | |
| 2012/0074546 | A1 | * | 3/2012 | Chong | ................. | H01L 21/561 |
| | | | | | | 257/676 |

OTHER PUBLICATIONS

U.S. Appl. No. 15/245,699, filed Aug. 24, 2016, Lamar et al.

* cited by examiner

*Primary Examiner* — Bryan Junge
(74) *Attorney, Agent, or Firm* — Daly, Crowley, Mofford & Durkee, LLP

(57) ABSTRACT

An integrated circuit includes a lead frame having a die attach paddle with a slot extending through the die attach paddle from a first surface to a second surface. A plurality of semiconductor die are positioned such that a channel is formed between the first, second, and third semiconductor die and the slot of the die attach paddle. A mold material encloses the plurality of semiconductor die and at least a portion of the lead frame and is disposed in the channel such that the second surface of the die attach paddle is substantially flush with the mold material. A method of forming an integrated circuit is also provided.

37 Claims, 12 Drawing Sheets

US 10,049,969 B1

INTEGRATED CIRCUIT

CROSS REFERENCE TO RELATED APPLICATIONS

Not Applicable.

STATEMENT REGARDING FEDERALLY SPONSORED RESEARCH

Not Applicable.

FIELD

This disclosure relates generally to integrated circuits, and more particularly, to integrated circuits and methods of forming integrated circuits including a lead frame with a die attach paddle having a slot formed therein for preventing a mold void in a channel formed between abutting semiconductor die.

BACKGROUND

As is known, integrated circuits are used in a variety of applications. One example application is in sensing applications in which a circuit including one or more sensing elements is used to detect one or more parameters. Magnetic field sensor integrated circuits, for example, include one or more magnetic field sensing elements, generally in combination with other circuit components, to detect a magnetic field. Some integrated circuits include more than one semiconductor die and a lead frame supporting the semiconductor die and having a plurality of leads through which electrical connections between the internal circuitry and external circuits or systems are made. The semiconductor die and at least a portion of the lead frame may be overmolded with a plastic or other protective material.

SUMMARY

Described herein are integrated circuits and techniques to fabricate integrated circuits including a lead frame with a die attach paddle having a slot configured to prevent a mold void (e.g., air bubbles) in a gap or channel formed between abutting semiconductor die of the integrated circuit. The slot may also be found to reduce or prevent other defects (e.g., weld lines) which may otherwise occur during fabrication of the integrated circuit. As is known, mold voids, for example, may negatively impact reliability and performance of an integrated circuit, for example, when an integrated circuit is subjected to stresses such as temperature cycling, autoclave, and highly accelerated stress testing (HAST). In high precision applications such as automobiles, accuracy in magnetic field sensing by a magnetic field sensor integrated circuit, for example, such as may be used to detect motion of a target object, can be critical. Engine ignition timing, for example, depends on consistent detection accuracy. Therefore, it is generally desirable to reduce or prevent mold voids in an integrated circuit (i.e., in a magnetic field sensor integrated circuit and in other types of integrated circuits).

In one aspect of the concepts described herein, an integrated circuit includes a lead frame having a die attach paddle with a first surface, a second opposing surface, and a slot extending through the die attach paddle from the first surface to the second surface. The slot is disposed between a first area of the first surface and a second area of the first surface.

The integrated circuit also includes a plurality of semiconductor die including at least a first semiconductor die disposed over the first area of the first surface, a second semiconductor die disposed over the second area of the first surface, and a third semiconductor die disposed over portions of the first and second semiconductor die such that a channel is formed between the first semiconductor die, the second semiconductor die, the third semiconductor die, and the slot in the die attach paddle. The first semiconductor die, the second semiconductor die, the third semiconductor die and the channel may form a pyramid type structure (e.g., 2+1 stack die pyramid structure).

The integrated circuit additionally includes a mold material enclosing the plurality of semiconductor die and at least a portion of the lead frame. The mold material is disposed in the channel such that the second surface of the die attach paddle is substantially flush with the mold material. The slot in the die attach paddle may prevent a void (i.e., a mold void) in the channel.

The integrated circuit may include one or more of the following features individually or in combination with other features. The mold material may substantially fill the channel. The mold material may be introduced into the channel in a transfer molding process. The mold material may be introduced into the channel in a direction substantially perpendicular to a length of the slot. A first adhesive layer may be disposed between the first semiconductor die and the first area of the die attach paddle. A second adhesive layer may be disposed between the second semiconductor die and the second area of the die attach paddle. The die attach paddle may have a first thickness between the first surface and the second surface and a thinned area adjacent to an edge of the slot. The thinned area may have a second thickness less than the first thickness of the die attach paddle.

The first semiconductor die and the second semiconductor die may each have an edge that is substantially vertically aligned with a respective edge of the slot in the die attach paddle. The first semiconductor die and the second semiconductor die may each have an edge that is substantially vertically aligned with the slot in the die attach paddle. The slot may have a shape corresponding to a rectangle, a square, or an oval. The lead frame may further include a plurality of leads and each of the plurality of semiconductor die may include one or more bond pads. The bond pads may be electrically coupled to respective ones of the plurality of leads. A plurality of wire bonds may be coupled between the bond pads and the respective ones of the plurality of leads. The bond pads may be supported by respective surfaces of the plurality of semiconductor die. The plurality of semiconductor die may be positioned over the die attach paddle such that the bond pads are not positioned over the slot in the die attach paddle.

The first semiconductor die may support at least one first magnetic field sensing element. The second semiconductor die may support at least one second magnetic field sensing element. The third semiconductor die may support at least one third magnetic field sensing element. The at least one first magnetic field sensing element, the at least one second magnetic field sensing element, and the at least one third magnetic field sensing element may be spaced apart from each other by respective predetermined distances. The slot may have a width selected to achieve the predetermined distance between the at least one first magnetic field sensing element supported by the first semiconductor die and the at least one second magnetic field sensing element supported by the second semiconductor die. The width of the slot may be on the order of about 0.5 millimeters (mm).

In a further aspect of the concepts described herein, a method of forming an integrated circuit includes providing a lead frame including a die attach paddle having a first surface and second opposing surface, and a slot extending from the first surface to the second surface between a first area of the first surface and a second area of the first surface. The method also includes positioning a first semiconductor die over the first area and positioning a second semiconductor die over the second area. The method additionally includes positioning a third semiconductor die over portions of the first and second semiconductor die such that a channel is formed between the first semiconductor die, the second semiconductor die, the third semiconductor die, and the slot in the die attach paddle. The first, second, and third semiconductor die and at least a portion of the lead frame are enclosed with a mold material such that the mold material is disposed in the channel and is substantially flush with the second surface of the die attach paddle.

The method may include one or more of the following features individually or in combination with other features. The channel may be filled with the mold material. The mold material may be introduced into the channel in a transfer molding process. The mold material may be introduced into the channel in a direction substantially perpendicular to a length of the slot.

The method may further include providing a first adhesive layer between the first semiconductor die and the first area of the first surface of the die attach paddle and providing a second adhesive layer between the second semiconductor die and the second area of the first surface of the die attach paddle. The die attach paddle may have a first thickness between the first surface and the second surface and a thinned area adjacent to an edge of the slot. The thinned area may have a second thickness that is less than the first thickness of the die attach paddle.

The first semiconductor die may be positioned over the first area such that the first semiconductor die has an edge that is substantially vertically aligned with a respective edge of the slot in the die attach paddle and the second semiconductor die may be positioned over the second area such that the second semiconductor die has an edge that is substantially vertically aligned with a respective edge of the slot. Alternatively, the first semiconductor die may be positioned over the first area such that the first semiconductor die has an edge that is substantially vertically aligned with the slot in the die attach paddle and the second semiconductor die may be positioned over the second area such that the second semiconductor die has an edge that is substantially vertically aligned with the slot.

The slot in the die attach paddle may be provided with a shape corresponding to one of a rectangle, a square, or an oval and the lead frame may include a plurality of leads. Positioning a first semiconductor die may include electrically coupling one or more bond pads on the first semiconductor die to respective ones of the plurality of leads of the lead frame. The method may further include coupling a plurality of wire bonds between the bond pads and the respective ones of the plurality of leads. The first semiconductor die may be positioned such that the bond pads on the first semiconductor die are not positioned over the slot.

Positioning a first semiconductor die may include positioning the first semiconductor die supporting at least one first magnetic field sensing element over the first area. Positioning a second semiconductor die may include positioning the second semiconductor die supporting at least one second magnetic field sensing element over the second area. Positioning a third semiconductor die may include positioning the third semiconductor die supporting at least one third magnetic field sensing element over the portions of the first and second semiconductor die. The method may further include spacing the at least one first magnetic field sensing element, the at least one second magnetic field sensing element, and the at least one third magnetic field sensing element apart from each other by respective predetermined distances.

Providing a lead frame may include providing the slot in the die attach paddle with a width selected to achieve the predetermined distance between the at least one first magnetic field sensing element supported by the first semiconductor die and the at least one second magnetic field sensing element supported by the second semiconductor die. Providing the slot in the die attach paddle with a width selected to achieve the predetermined distance may include selecting the width of the slot to be on the order of about 0.5 mm.

In another aspect of the concepts described herein, an integrated circuit includes a lead frame including a die attach paddle having a first surface and second opposing surface. The integrated circuit also includes a plurality of semiconductor die including at least a first semiconductor die disposed over a first area of the first surface of the die attach paddle, a second semiconductor die disposed over a second area of the first surface of the die attach paddle, and a third semiconductor die disposed over portions of the first and second semiconductor die. A channel is formed between the first, second, and third semiconductor die and the integrated circuit additionally includes means for preventing a void in the channel.

The integrated circuit may include one or more of the following features individually or in combination with other features. A mold material may enclose the plurality of semiconductor die and at least a portion of the lead frame. The mold material may be disposed in the channel such that the second surface of the die attach paddle is substantially flush with the mold material. The means for preventing a void in the channel may include a slot extending through the die attach paddle from the first surface to the second surface between the first area of the die attach paddle and the second area of the die attach paddle. Each of the first semiconductor die and the second semiconductor die may have an edge that is substantially vertically aligned with a respective edge of the slot or each of the first semiconductor die and the second semiconductor die may have an edge that is substantially vertically aligned with the slot. The mold material may substantially fill the channel. The mold material may be introduced into the channel in a transfer molding process.

BRIEF DESCRIPTION OF THE DRAWINGS

The foregoing features of the disclosure, as well as the disclosure itself may be more fully understood from the following detailed description of the drawings, in which.

DETAILED DESCRIPTION

Figure 1:
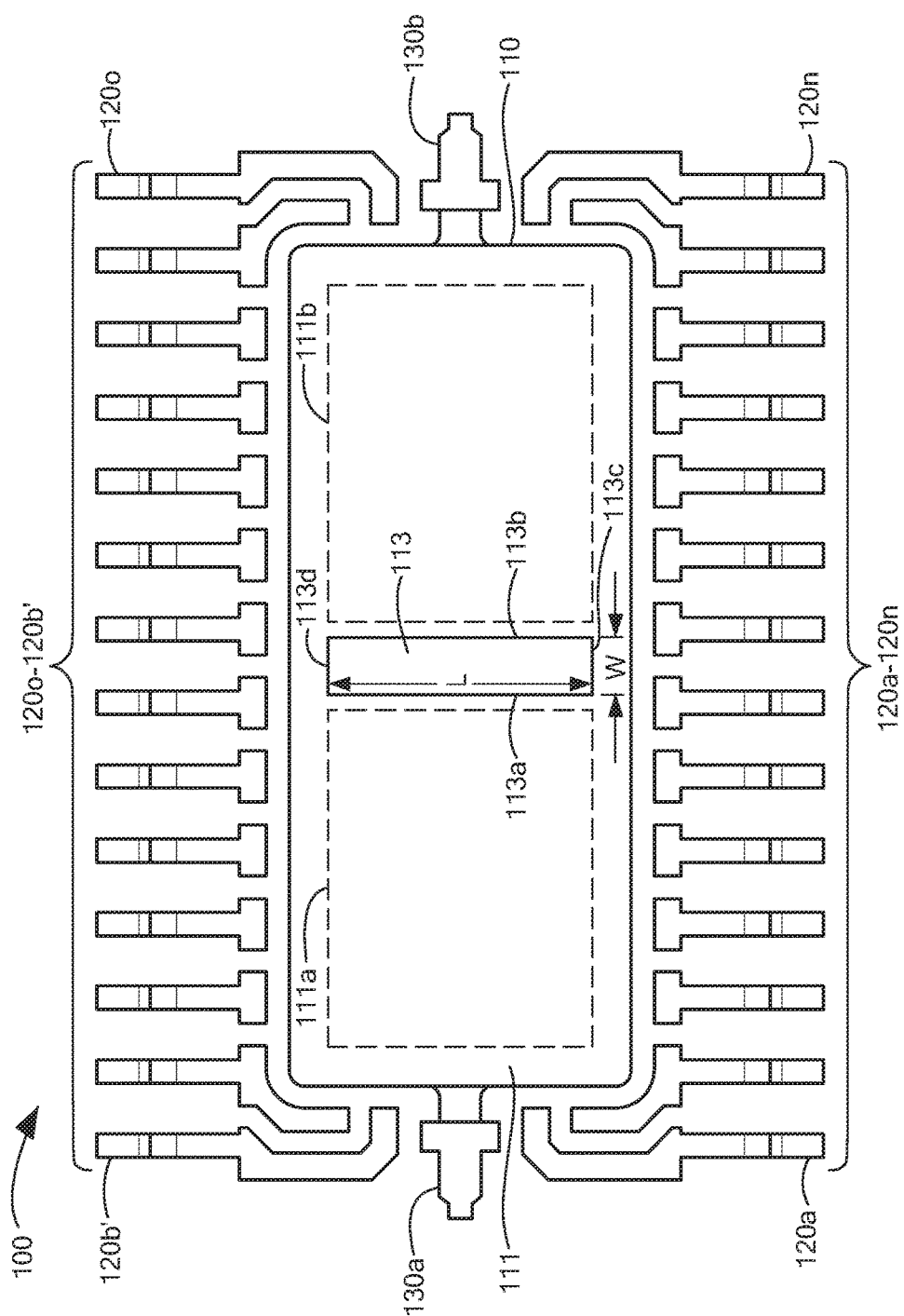
FIG. 1 is a top view of an example lead frame of an integrated circuit according to the disclosure.

Before describing the present disclosure, it should be noted that reference is sometimes made herein to integrated circuits (e.g., magnetic field sensor integrated circuits) including semiconductor die supporting magnetic field sensing elements. One of ordinary skill in the art will appreciate, however, that the techniques described herein are also applicable to integrated circuits including semiconductor die supporting elements and circuitry other than magnetic field sensing elements.

For convenience, certain introductory concepts and terms used in the specification are collected here.

As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

Referring to FIGS. 1-5B, example integrated circuit structures as may be provided in accordance with the concepts, systems, circuits and techniques sought to be protected herein are shown. While FIGS. 1-5B generally illustrate progression of a sequence of processes by which an integrated circuit may be manufactured, the illustrated process progression need not occur in the particular sequence shown. Rather, the processes may be re-ordered, combined or removed, performed in parallel or in series to achieve the results set forth above and below (e.g., preventing a mold void).

Figure 1A:
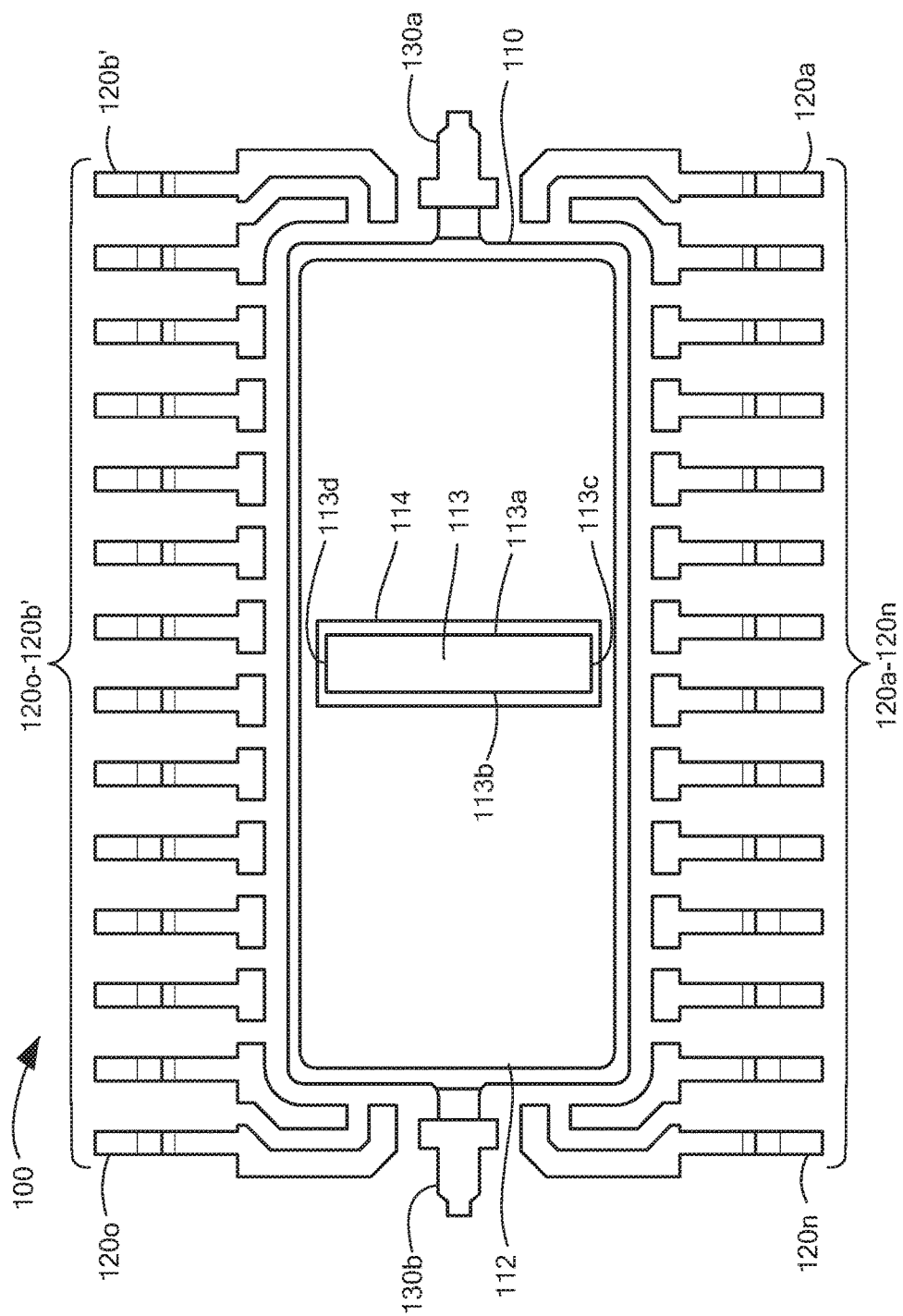
FIG. 1A is a bottom view of the lead frame of FIG. 1.
Figure 1B:
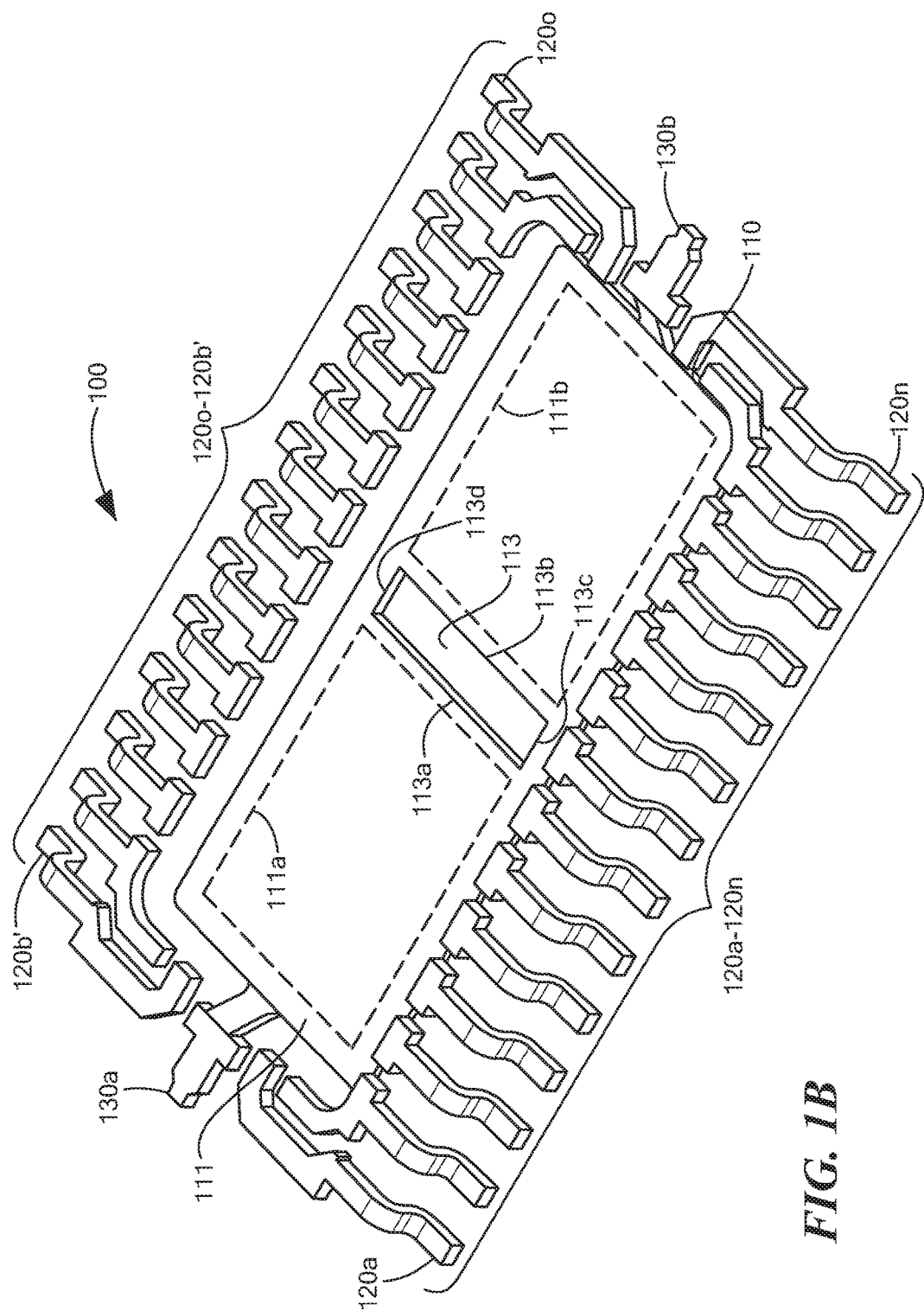
FIG. 1B is an isometric view of the top of the lead frame of FIG. 1.
Figure 1C:
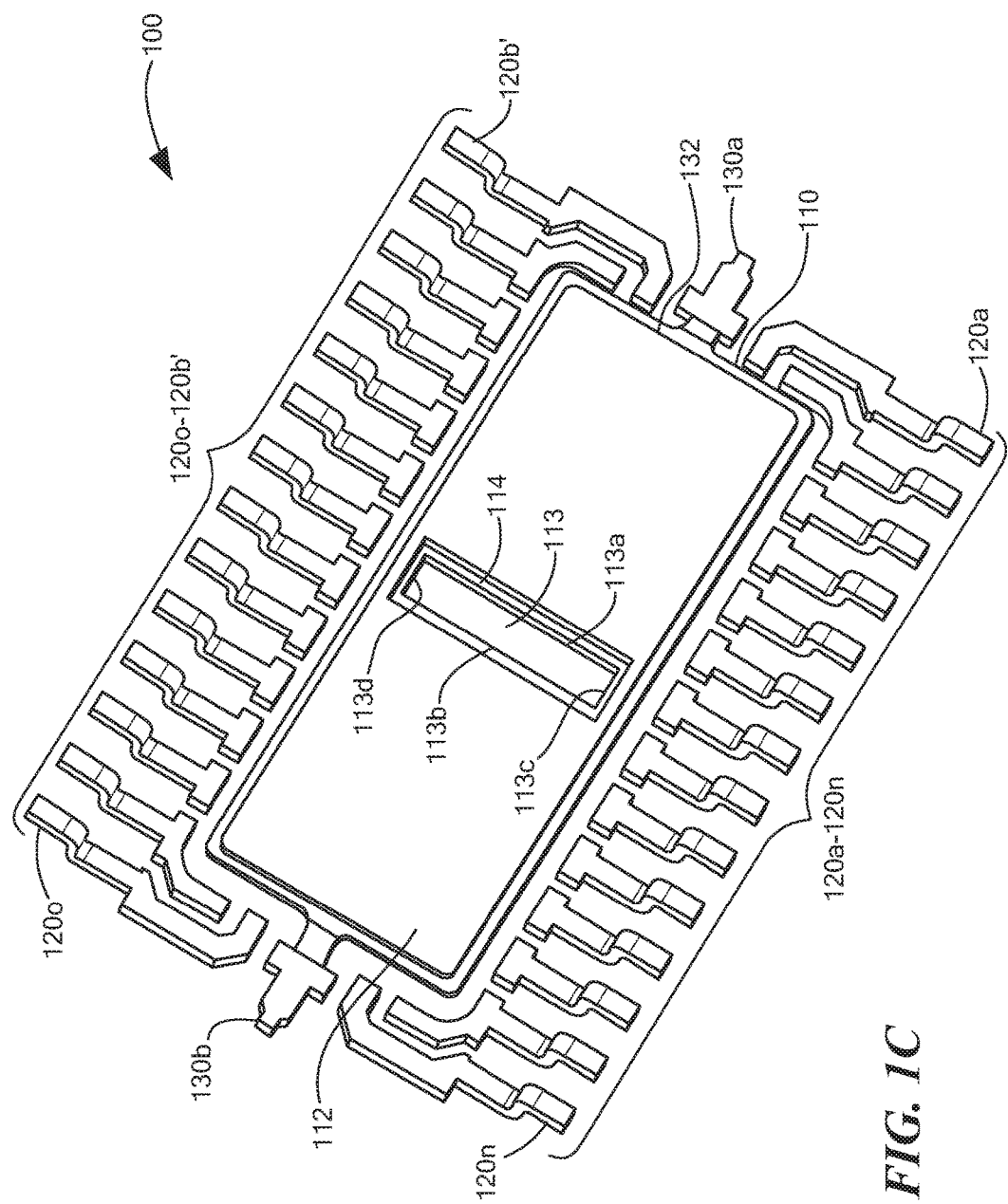
FIG. 1C is an isometric view of the bottom of the lead frame of FIG. 1.

Referring to FIGS. 1-1C, an example lead frame 100 of an integrated circuit (e.g., 500, shown in FIG. 5) according to the disclosure is shown. The lead frame 100, which may be comprised of one or more of copper, tin, nickel or alloy lead frame, for example, includes a die attach paddle 110 and a plurality of leads (here, leads 120a-120b'). The lead frame 100 also includes first and second lead frame tabs 130a, 130b at first and second ends of the die attach paddle 110.

The die attach paddle 110 has a first surface 111, as shown in the top views of FIGS. 1 and 1B, for example, and a second opposing surface 112, as shown in the bottom views of FIGS. 1A and 1C. The first surface 111 of the die attach paddle 110 has a first die attach area 111a on which a first semiconductor die (e.g., 210, shown in FIG. 2) may be disposed. Additionally, the first surface 111 of the die attach paddle 110 has a second die attach area 111b on which a second semiconductor die (e.g., 220, shown in FIG. 2) may be disposed. The first and second semiconductor die may be electronically coupled to the plurality of leads 120a-120b', as will be discussed further below.

The die attach paddle 110 includes slot 113 between the first area 111a of the first surface 111 and the second area 111b of the first surface 111. The slot 113 extends through the die attach paddle 110 from the first surface 111 to the second surface 112. In the illustrated embodiment, the slot 113 has a shape corresponding to a rectangle when viewed from the top of the lead frame 100, as shown in FIG. 1, for example. The slot 113 has a respective length (L) and width (W). A first dimension of the slot 113 with respect to a major axis of the first surface 111 of the die attach paddle 110 may correspond to the width of the slot 113. Additionally, a second dimension of the slot 113 with respect to a minor axis of the first surface 111 may correspond to the length of the slot 113. In use of the lead frame 110 to support multiple semiconductor die as will be discussed below, the slot 113 is disposed at a periphery of a channel (e.g., 240, FIG. 3A) formed between abutting semiconductor die supported by the die attach paddle 110. The slot 113 may prevent a void in the channel (e.g., as may otherwise occur during a molding process), as will be discussed further below.

The die attach paddle 110 may have thinned area 114 adjacent to an edge (here, edges 113a, 113b, 113c, 113d) of the slot 113 from the second surface 112 of the die attach paddle 110, as shown in FIGS. 1A and 1C. For example, the die attach paddle 110 may have a first thickness between the first surface 111 and the second surface 112 and the thinned area 114 may have a second thickness that is less than the first thickness. As one example, the second thickness may be about half the first thickness and the thinned area 114 may therefore correspond to a so-called half etch area. In embodiments, the thinned area 114 may provide a locking feature or mechanism to enhance adhesion or locking of a mold material (e.g., 510, shown in FIG. 5) to the lead frame 100, as will be discussed further below. The thinned area 114 may substantially surround the edges (here, edges 113a, 113b, 113c, 113d) of the slot 113, as shown in FIGS. 1A and 1C. In other embodiments, the thinned area 114 may surround selected portions of slot edges or selected slot edges. Furthermore, additional thinned areas may be provided, such as the thinned area 132 along the peripheral edge of the die attach paddle 110, as shown in FIGS. 1A and 1C. It will be appreciated that other configurations of thinned areas may be provided, for example in other areas of the lead frame 100, with other thicknesses, and/or from the other surface (i.e., the first surface 111 of the die attach paddle 110).

The lead frame 100 shown in FIGS. 1-1C may be formed by various processes. For example, the lead frame 100, including the die attach paddle slot 113 and leads 120a-120b', may be formed by stamping a metal sheet or substrate. The slot 113 and leads 120a-120b' may also be formed by a photolithography and/or an etching process, for example.

It will be appreciated that one or more characteristics (e.g., shape and/or dimensions) of the lead frame 100 may be selected to suit a particular IC package. For example, in embodiments the lead frame 100 may be a lead frame for a Thin-Shrink Small Outline Package (TSSOP) package. Lead frame 100 may be provided in other configurations suitable for use with other integrated circuit package types and still include features and advantages explained herein.

While the lead frame 100 is shown having a particular number and configuration of leads (here, twenty eight leads 120a-120b') in FIGS. 1-1C, it should be appreciated that various numbers and configurations of leads are possible. For example, while leads 120a-120b' are surface mount leads, other lead types are possible.

Additionally, while slot 113 in the die attach paddle 110 is shown having a substantially rectangular shape in FIGS. 1-1C, it should be appreciated that the slot 113 may take the form of a variety of different shapes. For example, the slot 113 has a shape corresponding to a square, an oval or any number of other shapes.

Figure 2:
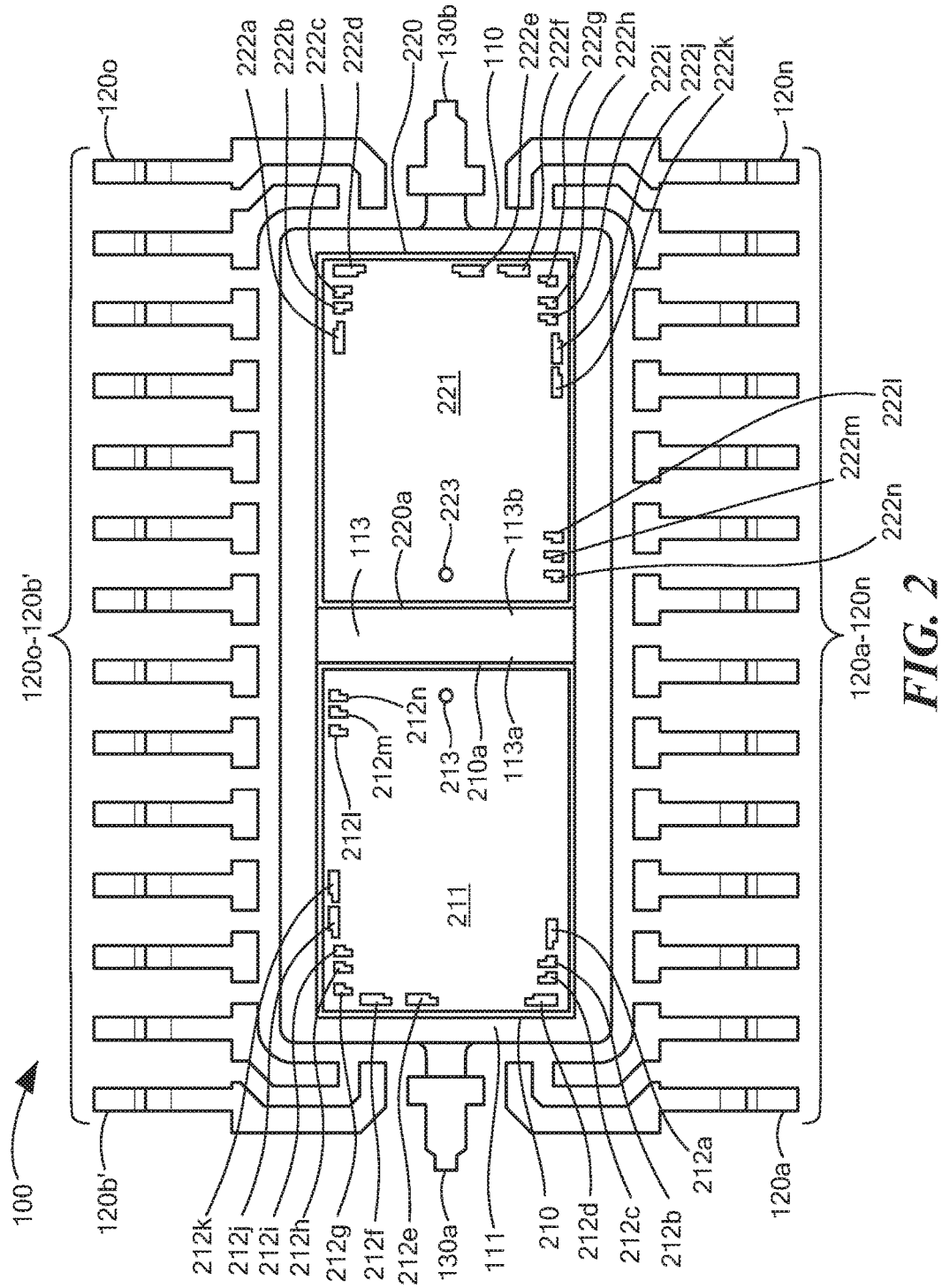
FIG. 2 is a diagram of a top view of the lead frame of FIG. 1 with first and second semiconductor die disposed over the lead frame.

Referring to FIG. 2, in which like elements of FIGS. 1-1C are shown having like reference designations, a first semiconductor die 210 is disposed over the first area of the die attach paddle (111a, FIG. 1) and a second semiconductor die 220 is disposed over the second area of the die attach paddle (111b, FIG. 1). More particularly, the first semiconductor die 210 has a first, active surface 211 distal from the die attach paddle area 111a and a second, opposing surface proximate to the die attach paddle area 111a. Additionally, the second semiconductor die 220, which may be the same as or similar to the first semiconductor die 210 in some embodiments, has a first, active surface 221 distal from the die attach paddle area 111b and a second, opposing surface proximate to the die attach paddle area 111b.

The first, active surface 211 of the first semiconductor die 210 supports a plurality of bond pads 212a-212n and one or more electrical components (here, at least one magnetic field sensing element 213). Similarly, the first, active surface 221 of the second semiconductor die 220 supports a plurality of bond pads 222a-222n and one or more electrical components (here, at least one magnetic field sensing element 223). In embodiments in which the integrated circuit (e.g., 500, shown in FIG. 5) in which the lead frame 100 and the first and second semiconductor die 210, 220 are provided is a magnetic field sensor, for example, the electrical components formed on the semiconductor die 210, 220 may include circuitry (e.g., signal processing circuitry) for processing respective magnetic field signals generated by the at least one first and second magnetic field sensing elements 213, 223, respectively.

The first and second die 210, 220 may be attached to the respective first and second die attach paddle areas 111a, 111b, for example, with one or more adhesives, such as epoxies or adhesive tapes or layers. For example, a first adhesive layer may be provided between the second surface of the first semiconductor die 210 and the first die attach paddle area 111a. Additionally, a second adhesive layer may be provided between the second surface of the second semiconductor die 220 and the second die attach paddle area 111b. In embodiments, at least one of the first adhesive layer and the second adhesive layer includes a non-conductive die attach film (DAF) adhesive.

In one example embodiment, the first adhesive layer and the second adhesive layer may be laminated onto the first semiconductor die 210 and the second semiconductor die 220, respectively. For example, the first semiconductor die 210 and the second semiconductor die 220 may be fabricated through a process in which: a semiconductor wafer is provided and a thickness of one or more surfaces of the wafer are adjusted (e.g., reduced) to a predetermined thickness, for example, through one or more grinding or polishing processes. The process may also include laminating the wafer with an adhesive layer (i.e., the first and second adhesive layer) and cutting ("dicing") the laminated wafer into a plurality of semiconductor die (i.e., at least the first and second semiconductor die 210, 220).

In the illustrated embodiment, the first and second semiconductor die 210, 220 have respective edges 210a, 220a that are substantially vertically aligned with respective edges of the slot 113 in the die attach paddle 110. More particularly, the first semiconductor die 210 has an edge 210a that is substantially vertically aligned with a respective edge 113a of the slot 113 and the second semiconductor die 220 has an edge 220a that is substantially vertically aligned with a second respective edge 113b of the slot 113. It will be appreciated that the die and slot dimensions need not be so precisely selected so as to have die edges 210a, 220a precisely vertically aligned with respective slot edges 113a, 113b. For example, the spacing between die edges 210a, 220a may be smaller than the width of the slot, such that the die edges 210a, 210b are substantially vertically aligned with the slot itself rather than with slot edges. Conversely, the spacing between die edges 210a, 220a may be greater the width of the slot 113.

In some embodiments, the at least one magnetic field sensing element 213 is spaced from the at least one magnetic field sensing element 223 by a first predetermined distance established by the integrated circuit design. In embodiments, the width of slot 113 may be selected to achieve the predetermined distance between magnetic field sensing elements 213, 223.

In some embodiments, the slot 113 formed in the die attach paddle 110 may have a width on the order of about 0.5 mm. In another embodiment, the width of the slot 113 is on the order of about 0.7 mm. It will be appreciated that the slot dimensions can be readily varied based on a variety of factors such as die dimensions and configurations and manufacturing considerations in order to prevent mold voids as explained below.

Additionally, in some embodiments a position of the first respective edge 210a of the first semiconductor die 210 with respect to edge 113a of the slot 113, and a position of the second respective edge 220a of the second semiconductor die 220 with respect to edge 113b of the slot 113, may be adjusted to achieve the first predetermined distance. For example, in one embodiment the first respective edge 210a of the first semiconductor die 210 and the second respective edge 220a of the second semiconductor die 220 may be spaced apart from respective edges 113a, 113b of the slot 113 to achieve a first predetermined distance. In another embodiment, the first respective edge 210a of the first semiconductor die 210 and the second respective edge 220a of the second semiconductor die 220 may overlap at least a portion of the slot 113 to achieve a first predetermined distance that is minimal (i.e., less than if the die 210, 220 were spaced apart from the respective edges 113a, 113b).

Figure 3:
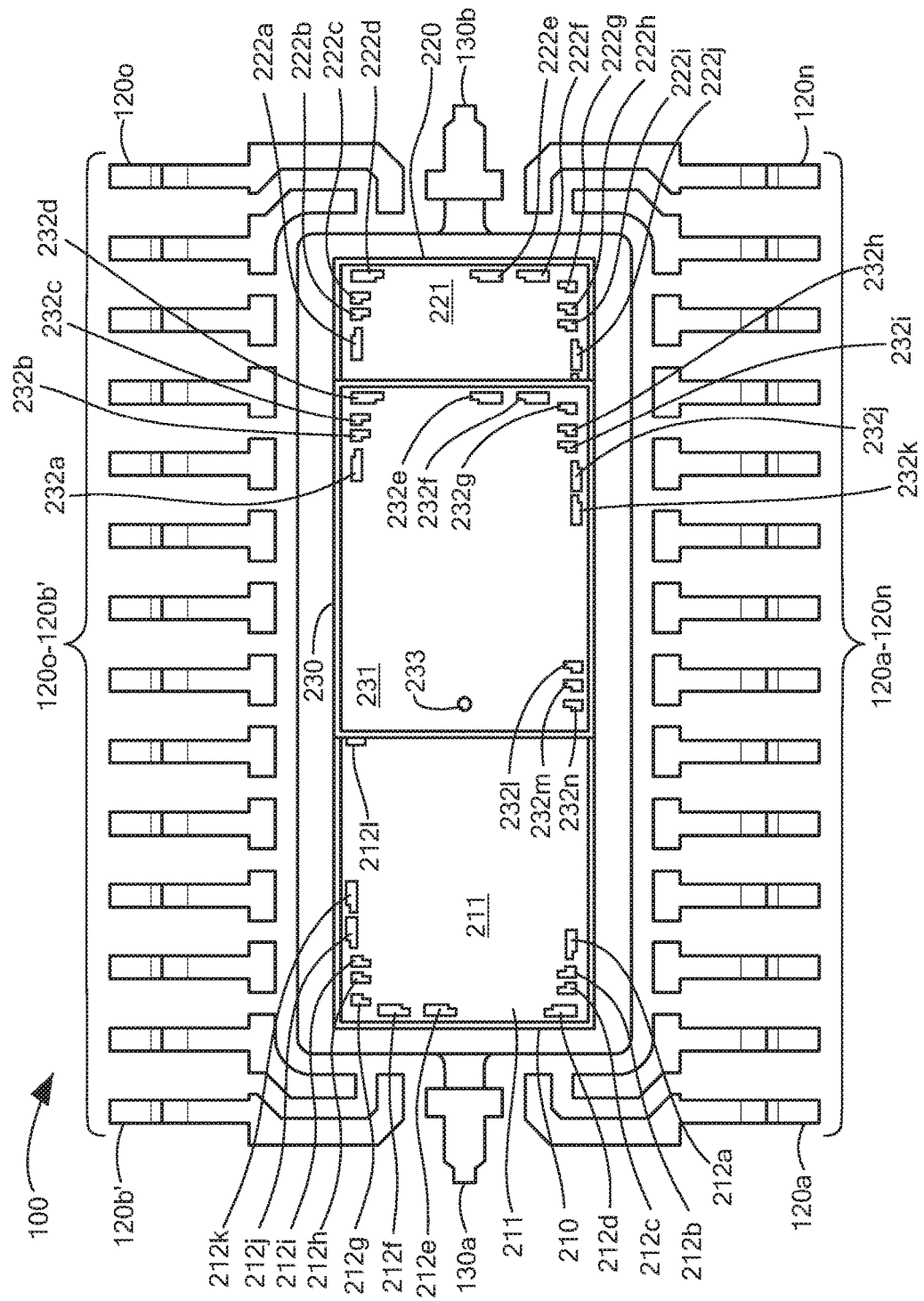
FIG. 3 is a top view of the lead frame of FIG. 1 with first, second and third semiconductor die disposed over the lead frame.
Figure 3A:
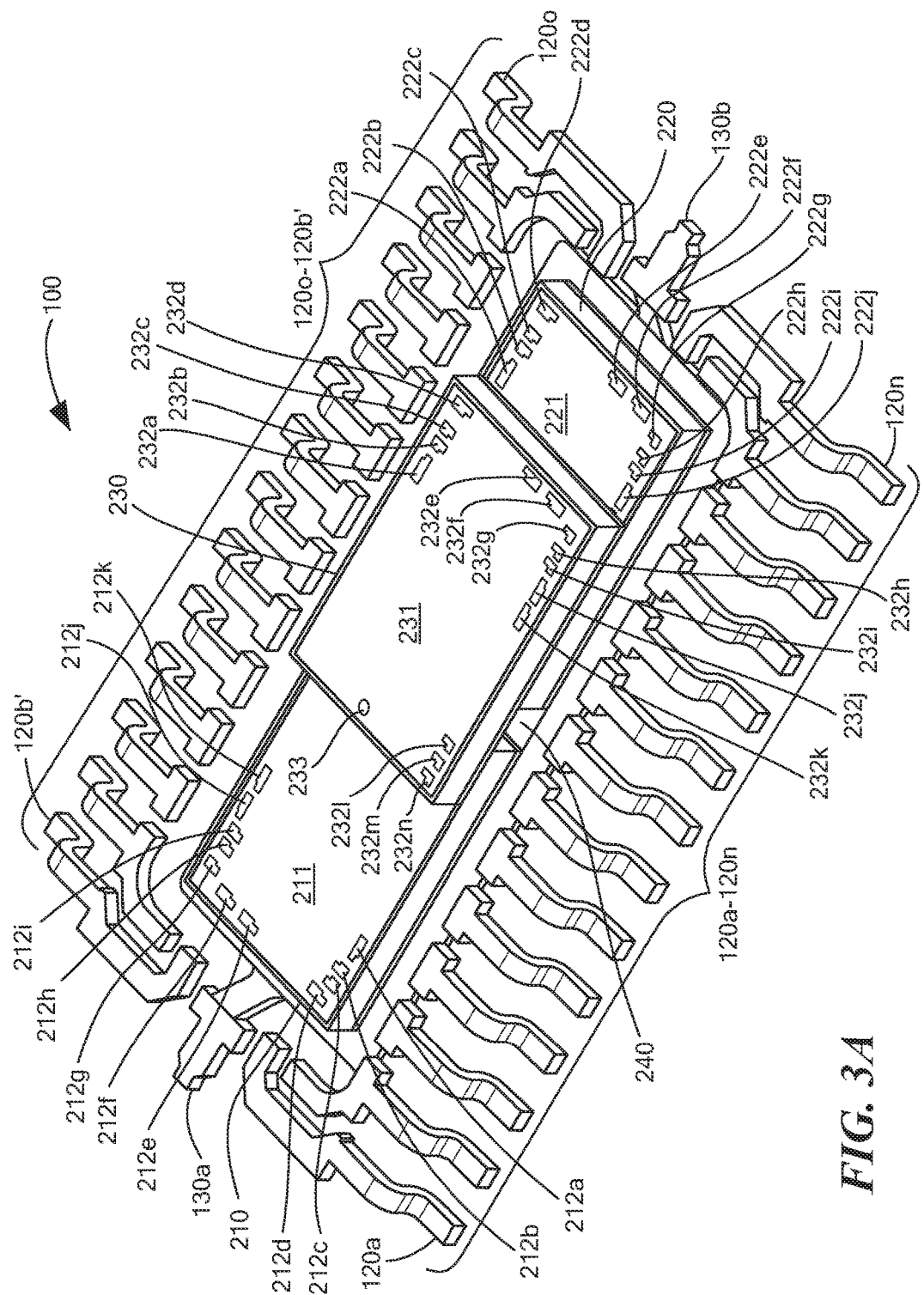
FIG. 3A is an isometric view of the structure of FIG. 3.

Referring to FIGS. 3 and 3A, a third semiconductor die 230 is disposed over selected portions of the first and second semiconductor die 210, 220 such that a channel 240 is formed between the first semiconductor die 210, the second semiconductor die 220, the third semiconductor die 230, and the slot 113 in the die attach paddle 110. More particularly, the third semiconductor die 230, which may be the same as or similar to at least one of the first and second semiconductor die 210, 220 in some embodiments, has a first, active surface 231 distal from the first and second semiconductor die 210, 220 and a second, opposing surface proximate to the first and second semiconductor die 210, 220.

The first, active surface 231 of the third semiconductor die 230 supports a plurality of bond pads 232a-232n and one or more electrical components (here, at least one magnetic field sensing element 233). In the illustrated embodiment, the at least one third magnetic field sensing element 233 may be spaced from the at least one second magnetic field sensing element 223 supported by the second semiconductor die 220 and the at least one first magnetic field sensing element 213 support by the first semiconductor die 210 by a second predetermined distance. The second predetermined distance may be selected to maintain a desired spacing between the sensing elements 213, 223, 233 in order to thereby achieve a desired magnetic field sensing result. For example, in an embodiment in which the integrated circuit containing die 210, 220, 230 is a magnetic field angle sensor with each die substantially identical and configured to provide independent angle sensing channels, it may be desirable to have the magnetic field sensing elements 213, 223, 233 closely and precisely spaced with respect to each other and with respect to a target magnet (not shown) positioned proximate to the integrated circuit package in use.

In an embodiment, the first, second, and third magnetic field sensing elements 213, 223, 233 are circular vertical Hall effect elements. It is to be appreciated that the magnetic field sensing elements 213, 223 could be magnetoresistance elements, for example. It is also possible to have each of the different die 210, 220 support more than one sensing element type or each die 210, 220 supports a different element type.

The second surface of the third semiconductor die 230 may be attached to the first and second semiconductor die 210, 220 with a third adhesive (e.g., a non-conductive DAF) disposed between the second surface of the third semiconductor die 230 and portions of the first and second semiconductor die 210, 220 on which the third semiconductor die 230 is disposed. The third adhesive may be laminated onto the third semiconductor die 230 in some embodiments.

In some embodiments, after the third semiconductor die 230 is positioned over the first and second semiconductor die 210, 220, the first, second and third adhesive layers which may be disposed beneath respective surfaces of the first, second and third semiconductor die 210, 220, 230 may be cured.

Additionally, in some embodiments, the first and second adhesive layers may be disposed beneath the respective surfaces of the first and second semiconductor die 210, 220 and cured prior to positioning the third semiconductor die 230 over the first and second semiconductor die 210, 220, and prior to disposing and curing the third adhesive layer.

In embodiments, such as the illustrated embodiment, the first, second and third semiconductor die 210, 220, 230 are each positioned over the die attach paddle 110 such that the bond pads (e.g., 212a) supported by the first, second and third semiconductor die 210, 220, 230 are not positioned over the slot 113 in the die attach paddle 110 (and the channel 240 formed between the first, second and third semiconductor 210, 220, 230). In some embodiments, such may correspond to the bond pads being positioned over the first and second die attach areas 111a, 111b of the die attach paddle 110. In embodiments, by not positioning the bond pads over the slot 113, such may reduce (or prevent) a number of conductive structures (e.g., 251a, as will be discussed below) which may be used for electrically coupling the bond pads to respective lead frame leads (e.g., 120a) from extending across the channel 240.

Figure 4:
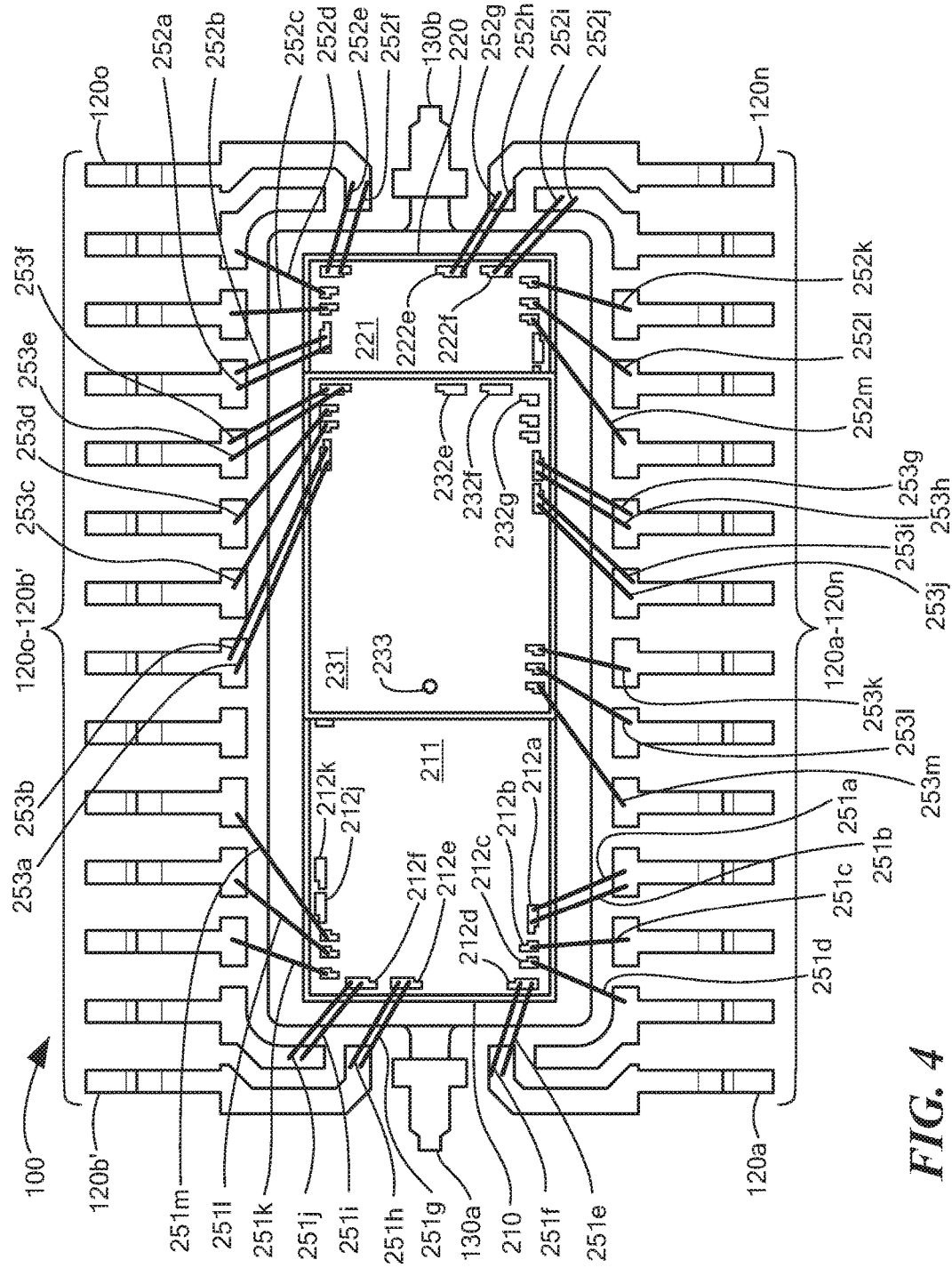
FIG. 4 shows the structure of FIG. 3 with bond pads of the first, second and third semiconductor die electrically coupled to leads of the lead frame.
Figure 4A:
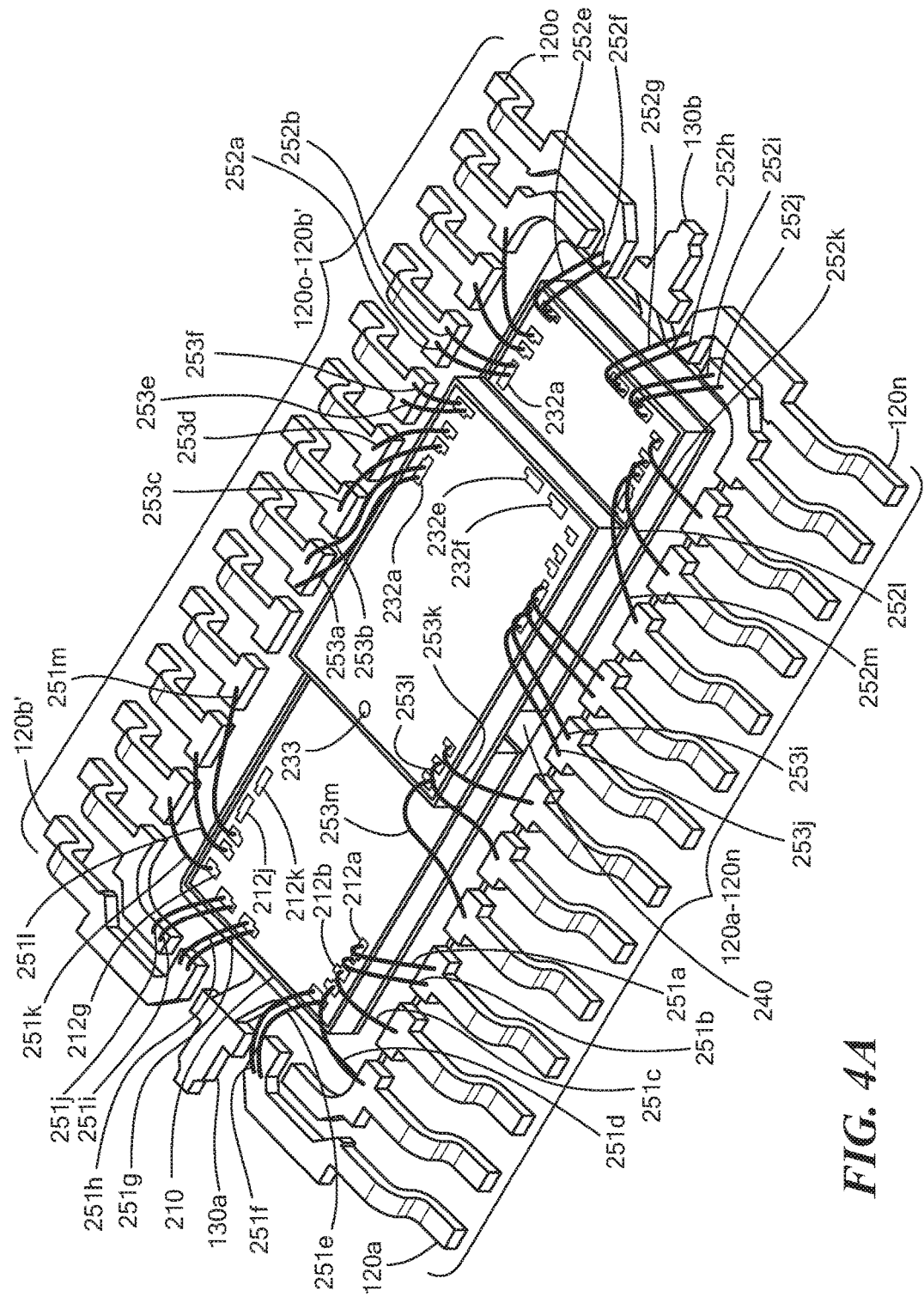
FIG. 4A is an isometric view of the structure of FIG. 4.

Referring to FIGS. 4 and 4A, bond pads (e.g., 212a) on the semiconductor die 210, 220, 230 are electrically coupled to respective leads 120a-120b' of the lead frame 100 through respective conductive structures 251a-251m, 252a-252m, 253a-253m, as shown. The conductive structures may include wire bonds, such as gold wire bonds, aluminum wire bonds, copper wire bonds, alloy wire bonds or the like, as shown in FIGS. 4 and 4A. The first, second and third conductive structures may also include ribbon bonds or tape-automated bonds ("TAB bonds") in some embodiments.

Figure 5:
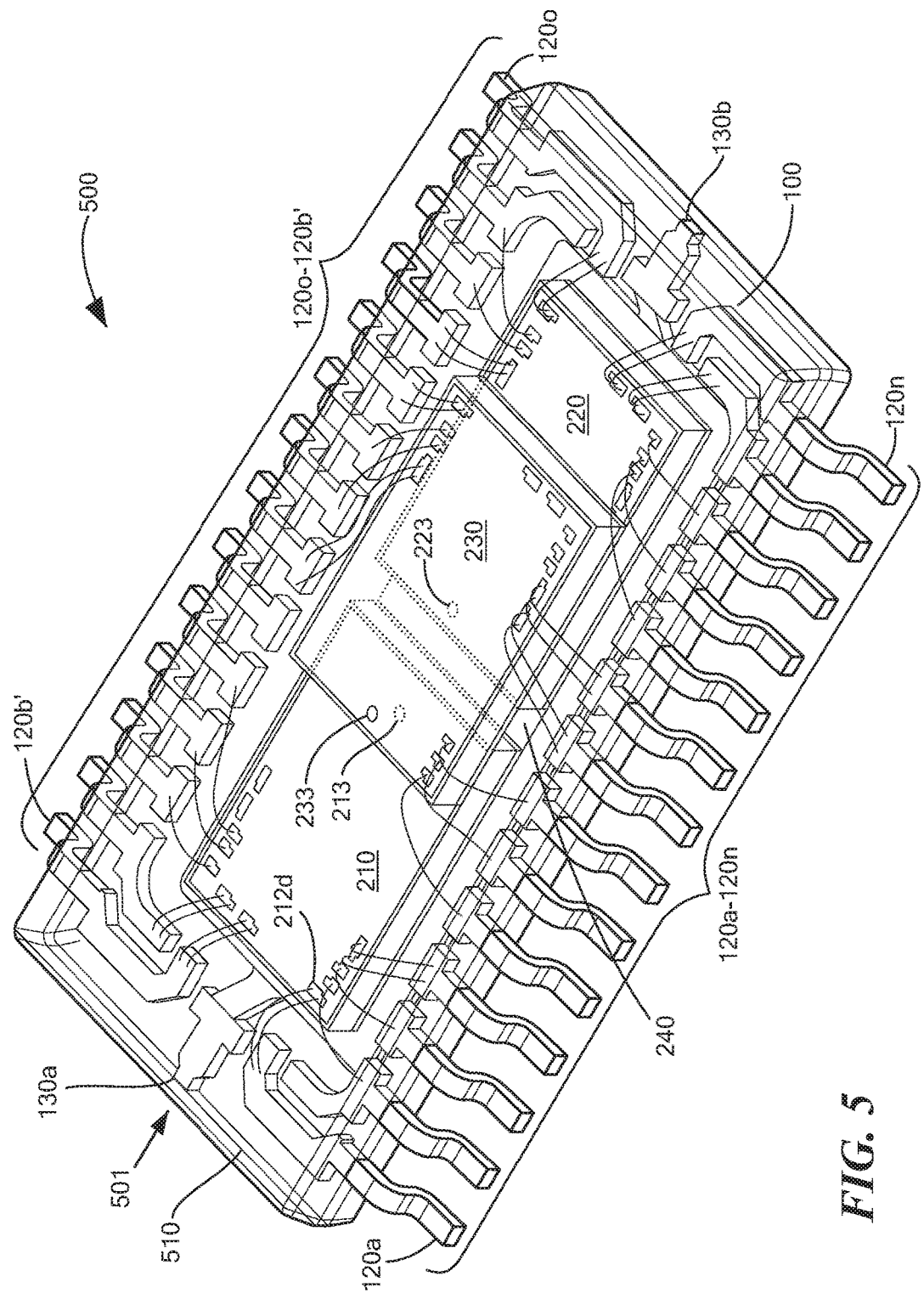
FIG. 5 is a transparent isometric view of the top of an integrated circuit formed by overmolding the structure of FIG. 4.
Figure 5A:
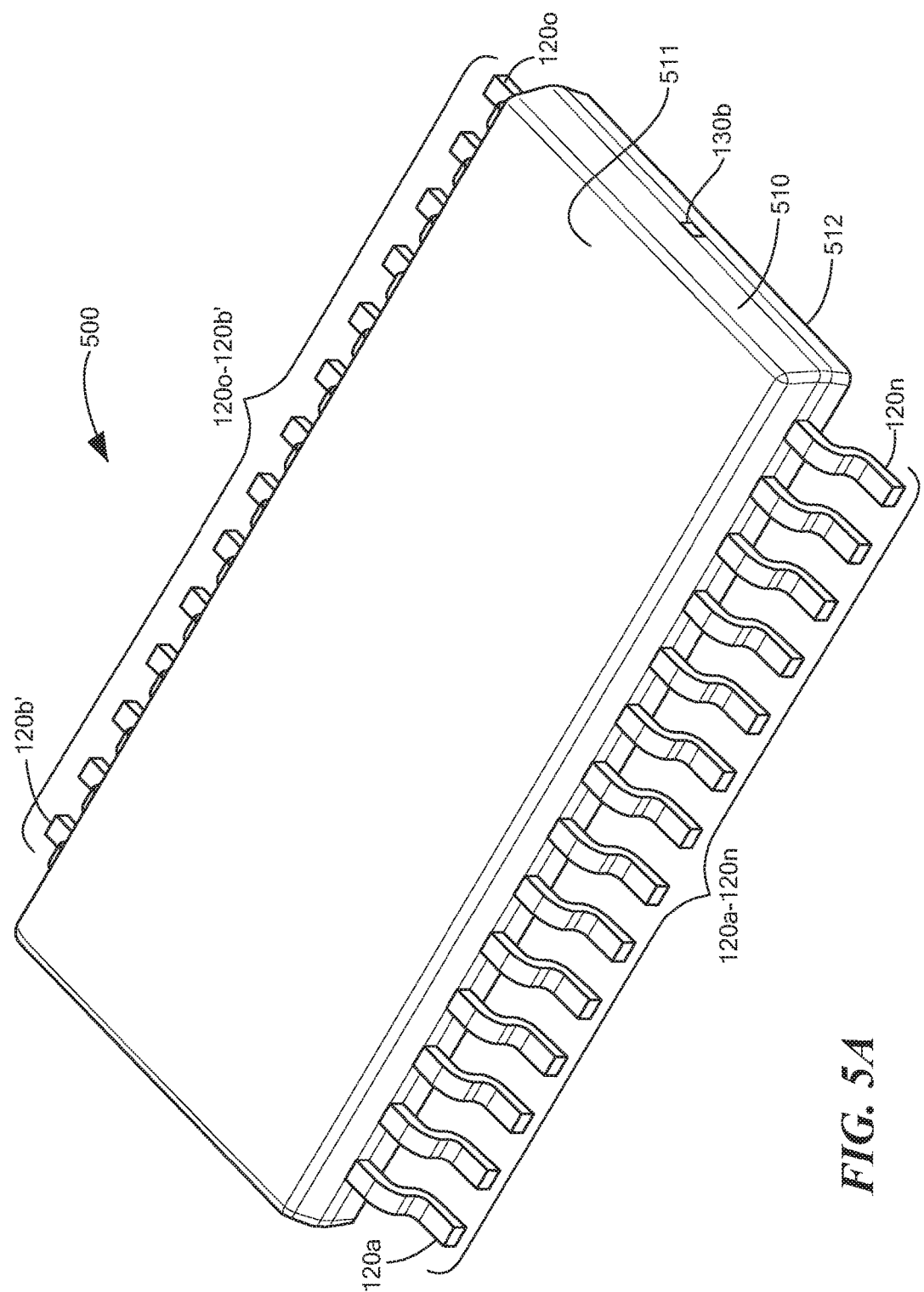
FIG. 5A is an isometric view of the top of the integrated circuit of FIG. 5.

Referring now to FIGS. 5 and 5A, the subassembly structure of FIG. 4 is overmolded with a mold material 510 to enclose or encapsulate the semiconductor die 210, 220, 230 and at least a portion of the lead frame 100. For example, the mold material 510 may be introduced into a mold chase or chamber (not shown) containing the structure of FIG. 4 through a transfer molding process in which a predetermined amount of the mold material 510 is introduced with a plunger. As the mold material 510 is introduced with the plunger, the mold material may be heated (e.g., to predetermined mold surface temperature of about 175° C., for example).

More particularly, in the illustrated embodiment, the mold material 510 is introduced into the channel 240 such that the mold material substantially fills the channel. In one example embodiment, the mold material 510 is introduced into the mold cavity from an end of the lead frame adjacent to a tab 130a, 130b and in a direction (i.e., in one direction) substantially perpendicular to the length of the slot 113 (FIG. 1). As one example, the mold material 510 may be introduced proximate to lead frame tab 130a of lead frame 100 in a direction indicated by arrow 501, which direction is substantially perpendicular to the length of the slot 113. The mold material 510 has a first surface 511 and a second, opposing surface 512, as shown in FIG. 5A. The mold material 510, once cured to form the integrated circuit package 500 shown in FIG. 5A, may be substantially flush with the second surface 112 (FIG. 1) of the die attach paddle 110 (FIG. 1), for example.

The presence of the slot 113 formed in the die attach paddle 110 has been found to substantially eliminate voids in the channel 240. This is in contrast to conventional integrated circuits in which voids occur in a gap or channel between abutting semiconductor die. In embodiments, the slot 113 in the die attach paddle 110 may push voids which may otherwise remain in the channel 240 to a surface (e.g., first surface 511 or second surface 512) of the mold material 510, resulting in one or more pits on the mold material surface. The pits can, for example, be substantially reduced or eliminated from the mold material surface during manufacture.

The mold material 510 may comprise a non-conductive material so as to electrically isolate and mechanically protect the semiconductor die 210, 220, 230 and wire bonds 251a-251m, 252a-252m, 253a-253m from damage by external environment factors such as moisture, heat, and shock. Suitable materials for the mold material 510 include thermoset compounds such as a thermoset based epoxy molding compound (EMC), thermoplastic mold compounds and other commercially available mold compounds. Example suitable EMC compounds include G605-L series mold compounds provided by Sumitomo Bakelite Company Limited.

It will be appreciated by those of ordinary skill in the art, that in some embodiments various other types of molding processes in addition to or in lieu of the above-described transfer molding process may be used to form the mold material 510. For example, compression molding processes may be used to form the mold material 510 in some embodiments.

Figure 5B:
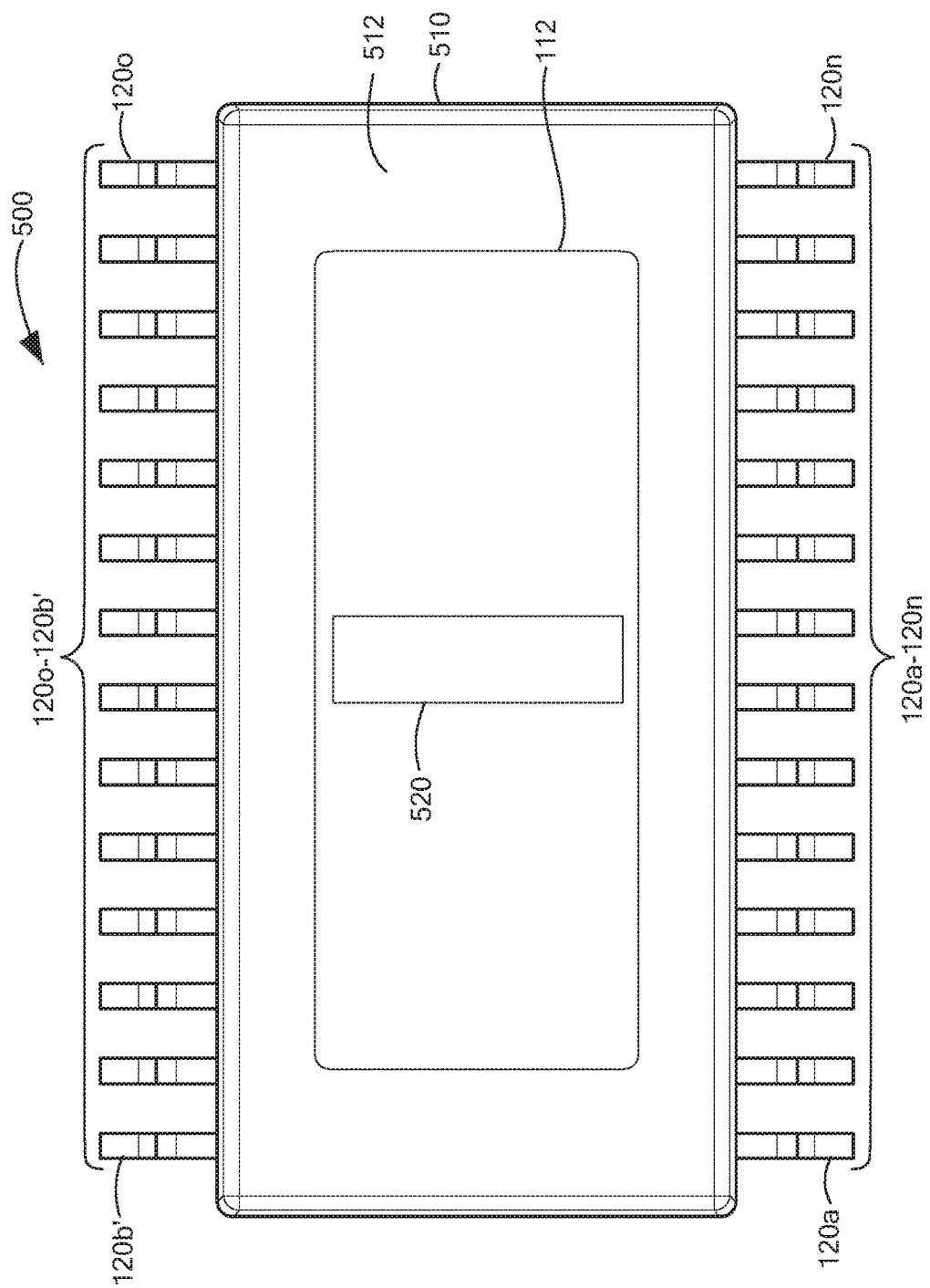
FIG. 5B is a bottom view of the integrated circuit of FIG. 5A.

Referring to FIG. 5B, a bottom view of the integrated circuit 500 of FIG. 5A is shown. As illustrated, the bottom surface of the integrated circuit 500 includes the bottom surface 512 of the mold material 510 surrounding the periphery of the die attach paddle 110, the bottom surface 112 (FIG. 1) of the die attach paddle 110 (FIG. 1), and portions 520 of the mold material 510 exposed through the slot 113 (FIG. 1).

In embodiments, the integrated circuit 500 takes the form of a magnetic field sensor IC, such as an angle sensor IC that senses an angle of a magnetic field. In operation, the angle sensor IC may be positioned in proximity to a moveable ferromagnetic object, or target, such as a gear, such that the at least one first, second and third magnetic field sensing elements 213, 223, 233 of the angle sensor IC are adjacent to the object and are thereby exposed to a magnetic field affected by motion of the object. The magnetic field sensing elements may generate respective magnetic field signals in response to the sensed magnetic field. The angle sensor IC may include circuitry (e.g., analog, digital or mixed signal processing circuitry) coupled to receive the magnetic field signals and configured to generate an output signal indicative of at least an angle of the sensed magnetic field.

While the integrated circuit 500 can take the form of angle sensor IC in the above-described example, it will be appreciated that the integrated circuit 500 make take the form of various of types of magnetic field sensor ICs, such as a current sensor that senses a magnetic field generated by a current carried by a conductor, a rotation detector, a linear magnetic field sensor, or a magnetic switch as a few examples.

Additionally, while the integrated circuit 500 is shown to include three semiconductor die arranged in a pyramid-like configuration (e.g., a 2+1 stack die pyramid structure), it should be appreciated that more than three semiconductor die can be used in integrated circuits according to the disclosure. For example, in an integrated circuit using five semiconductor die (e.g., a 3+2 stack die pyramid structure), a lead frame of the integrated circuit can include a die attach paddle with a first slot disposed between a first area of the die attach paddle and a second area of the die attach paddle and a second slot disposed between the second area of the die attach paddle and a third area of the die attach paddle. A first semiconductor die may be disposed over the first area, a second semiconductor die may be disposed over the second area and a third semiconductor die may be disposed over the third area. Additionally, a fourth semiconductor die may be disposed over selected portions of the first and second semiconductor die such that a first channel is formed between the first semiconductor die, the second semiconductor die, the fourth semiconductor die, and the first slot in the die attach paddle. Further, a fifth semiconductor die may be disposed over selected portions of the second and third semiconductor die such that a second channel is formed between the second semiconductor die, the third semiconductor die, the fifth semiconductor die, and the second slot in the die attach paddle.

As described above and as will be appreciated by those of ordinary skill in the art, embodiments of the disclosure herein may be configured as a system, method, or combination thereof. Accordingly, embodiments of the present disclosure may be comprised of various means including hardware, software, firmware or any combination thereof.

Having described preferred embodiments, which serve to illustrate various concepts, structures and techniques, which are the subject of this patent, it will now become apparent to those of ordinary skill in the art that other embodiments incorporating these concepts, structures and techniques may be used. Additionally, elements of different embodiments described herein may be combined to form other embodiments not specifically set forth above.

Accordingly, it is submitted that that scope of the patent should not be limited to the described embodiments but rather should be limited only by the spirit and scope of the following claims.

What is claimed is:

1. An integrated circuit, comprising:
   a lead frame comprising a die attach paddle having a first surface and a second opposing surface, the die attach paddle comprising a slot extending through the die attach paddle from the first surface to the second surface, wherein the slot is disposed between a first area of the first surface and a second area of the first surface;
   a plurality of semiconductor die comprising at least a first semiconductor die disposed over the first area, a second semiconductor die disposed over the second area, and a third semiconductor die disposed over portions of the first and second semiconductor die such that a channel is formed between the first semiconductor die, the second semiconductor die, the third semiconductor die, and the slot in the die attach paddle; and
   a mold material enclosing the plurality of semiconductor die and at least a portion of the lead frame, wherein the mold material is disposed in the channel such that the second surface of the die attach paddle is substantially flush with the mold material;
   wherein the first semiconductor die supports at least one first magnetic field sensing element, the second semiconductor die supports at least one second magnetic field sensing element, and the third semiconductor die supports at least one third magnetic field sensing element, wherein the at least one first magnetic field sensing element, the at least one second magnetic field sensing element, and the at least one third magnetic field sensing element are spaced apart from each other by respective predetermined distances.

2. The integrated circuit of claim 1 wherein the mold material substantially fills the channel.

3. The integrated circuit of claim 1 wherein the mold material is introduced into the channel in a transfer molding process.

4. The integrated circuit of claim 3 wherein the mold material is introduced into the channel in a direction substantially perpendicular to a length of the slot.

5. The integrated circuit of claim 1 further comprising a first adhesive layer disposed between the first semiconductor die and the first area of the die attach paddle and a second adhesive layer disposed between the second semiconductor die and the second area of the die attach paddle.

6. The integrated circuit of claim 1 wherein the die attach paddle has a first thickness between the first surface and the second surface and a thinned area adjacent to an edge of the slot, wherein the thinned area has a second thickness less than the first thickness of the die attach paddle.

7. The integrated circuit of claim 1 wherein each of the first semiconductor die and the second semiconductor die has an edge that is substantially vertically aligned with a respective edge of the slot in the die attach paddle.

8. The integrated circuit of claim 1 wherein each of the first semiconductor die and the second semiconductor die has an edge that is substantially vertically aligned with the slot in the die attach paddle.

9. The integrated circuit of claim 1 wherein the slot has a shape corresponding to one of a rectangle, a square, or an oval.

10. The integrated circuit of claim 1 wherein the lead frame further comprises a plurality of leads and each of the plurality of semiconductor die comprises one or more bond pads, wherein the bond pads are electrically coupled to respective ones of the plurality of leads.

11. The integrated circuit of claim 10 further comprising a plurality of wire bonds coupled between the bond pads and the respective ones of the plurality of leads.

12. The integrated circuit of claim 10 wherein the bond pads are supported by respective surfaces of the plurality of semiconductor die and the plurality of semiconductor die are positioned over the die attach paddle such that the bond pads are not positioned over the slot in the die attach paddle.

13. The integrated circuit of claim 1 wherein the slot has a width selected to achieve the predetermined distance between the at least one first magnetic field sensing element supported by the first semiconductor die and the at least one second magnetic field sensing element supported by the second semiconductor die.

14. The integrated circuit of claim 13 wherein the width of the slot is on the order of about 0.5 mm.

15. A method of forming an integrated circuit, comprising:
providing a lead frame comprising a die attach paddle having a first surface and a second opposing surface, the die attach paddle comprising a slot extending from the first surface to the second surface, wherein the slot is disposed between a first area of the first surface and a second area of the first surface;
positioning a first semiconductor die over the first area;
positioning a second semiconductor die over the second area;
positioning a third semiconductor die over portions of the first and second semiconductor die such that a channel is formed between the first semiconductor die, the second semiconductor die, the third semiconductor die, and the slot in the die attach paddle; and
enclosing the first, second and third semiconductor die and at least a portion of the lead frame with a mold material such that the mold material is disposed in the channel and is substantially flush with the second surface of the die attach paddle;
wherein positioning a first semiconductor die comprises positioning the first semiconductor die supporting at least one first magnetic field sensing element over the first area, and wherein positioning a second semiconductor die comprises positioning the second semiconductor die supporting at least one second magnetic field sensing element over the second area, and wherein positioning a third semiconductor die comprises positioning the third semiconductor die supporting at least one third magnetic field sensing element over the portions of the first and second semiconductor die.

16. The method of claim 15 wherein enclosing the first, second and third semiconductor die and at least a portion of the lead frame with the mold material comprises substantially filling the channel with the mold material.

17. The method of claim 15 wherein enclosing the first, second, and third semiconductor die and at least a portion of the lead frame with the mold material comprises introducing the mold material into the channel in a transfer molding process.

18. The method of claim 17 wherein introducing the mold material into the channel comprises introducing the mold material into the channel in a direction substantially perpendicular to a length of the slot.

19. The method of claim 15, further comprising:
providing a first adhesive layer between the first semiconductor die and the first area of the first surface of the die attach paddle; and
providing a second adhesive layer between the second semiconductor die and the second area of the first surface of the die attach paddle.

20. The method of claim 15 wherein providing a lead frame comprises providing the die attach paddle with a first thickness between the first surface and the second surface and providing the die attach paddle with a thinned area adjacent to an edge of the slot, wherein the thinned area has a second thickness less than the first thickness of the die attach paddle.

21. The method of claim 15 wherein positioning a first semiconductor die comprises positioning the first semiconductor die over the first area such that the first semiconductor die has an edge that is substantially vertically aligned with a respective edge of the slot in the die attach paddle; and
wherein positioning a second semiconductor die comprises positioning the second semiconductor die over the second area such that the second semiconductor die has an edge that is substantially vertically aligned with a respective edge of the slot.

22. The method of claim 15 wherein positioning a first semiconductor die comprises positioning the first semiconductor die over the first area such that the first semiconductor die has an edge that is substantially vertically aligned with the slot in the die attach paddle and wherein positioning a second semiconductor die comprises positioning the second semiconductor die over the second area such that the second semiconductor die has an edge that is substantially vertically aligned with the slot.

23. The method of claim 15 wherein providing a lead frame comprises providing the slot in the die attach paddle with a shape corresponding to one of a rectangle, a square, or an oval.

24. The method of claim 15 wherein providing a lead frame comprises providing the lead frame with a plurality of leads.

25. The method of claim 24 wherein positioning a first semiconductor die comprises electrically coupling one or more bond pads on the first semiconductor die to respective ones of the plurality of leads of the lead frame.

26. The method of claim 25 further comprising coupling a plurality of wire bonds between the bond pads and the respective ones of the plurality of leads.

27. The method of claim 25 further comprising positioning the first semiconductor die such that the bond pads on the first semiconductor die are not positioned over the slot.

28. The method of claim 15 further comprising spacing the at least one first magnetic field sensing element, the at least one second magnetic field sensing element, and the at least one third magnetic field sensing element apart from each other by respective predetermined distances.

29. The method of claim 28 wherein providing a lead frame comprises providing the slot in the die attach paddle with a width selected to achieve the predetermined distance between the at least one first magnetic field sensing element support by the first semiconductor die and the at least one second magnetic field sensing element supported by the second semiconductor die.

30. The method of claim 29 wherein providing the slot in the die attach paddle with a width selected to achieve the predetermined distance comprises selecting the width of the slot to be on the order of about 0.5 mm.

31. An integrated circuit, comprising:
a lead frame comprising a die attach paddle having a first surface and a second opposing surface;
a plurality of semiconductor die comprising at least a first semiconductor die disposed over a first area of the first surface of the die attach paddle, a second semiconductor die disposed over a second area of the first surface of the die attach paddle, and a third semiconductor die disposed over portions of the first and second semiconductor die, wherein a channel is formed between the first, second, and third semiconductor die; and
means for preventing a void in the channel formed between the first, second, and third semiconductor die;
wherein the first semiconductor die supports at least one first magnetic field sensing element, the second semiconductor die supports at least one second magnetic field sensing element, and the third semiconductor die supports at least one third magnetic field sensing element, wherein the at least one first magnetic field sensing element, the at least one second magnetic field sensing element, and the at least one third magnetic field sensing element are spaced apart from each other by respective predetermined distances.

32. The integrated circuit of claim 31 further comprising a mold material enclosing the plurality of semiconductor die and at least a portion of the lead frame, wherein the mold material is disposed in the channel such that the second surface of the die attach paddle is substantially flush with the mold material.

33. The integrated circuit of claim 32 wherein the mold material substantially fills the channel.

34. The integrated circuit of claim 32 wherein the mold material is introduced into the channel in a transfer molding process.

35. The integrated circuit of claim 33 wherein the means for preventing a void in a channel comprises a slot extending through the die attach paddle from the first surface to the second surface between the first area of the first surface of the die attach paddle and the second area of the first surface of the die attach paddle.

36. The integrated circuit of claim 35 wherein each of the first semiconductor die and the second semiconductor die has an edge that is substantially vertically aligned with a respective edge of the slot.

37. The integrated circuit of claim 35 wherein each of the first semiconductor die and the second semiconductor die has an edge that is substantially vertically aligned with the slot.

* * * * *

UNITED STATES PATENT AND TRADEMARK OFFICE
CERTIFICATE OF CORRECTION

PATENT NO. : 10,049,969 B1
APPLICATION NO. : 15/624875
DATED : August 14, 2018
INVENTOR(S) : Shixi Louis Liu Page 1 of 1

It is certified that error appears in the above-identified patent and that said Letters Patent is hereby corrected as shown below:

In the Specification

Column 7, Line 37 delete "twenty eight" and replace with --twenty-eight--.

Signed and Sealed this
Eleventh Day of December, 2018

Andrei Iancu
*Director of the United States Patent and Trademark Office*